US008405191B2

(12) United States Patent
Tuttle

(10) Patent No.: US 8,405,191 B2
(45) Date of Patent: Mar. 26, 2013

(54) SEMICONDUCTOR DEVICE STRUCTURES

(75) Inventor: Mark E. Tuttle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/590,991

(22) Filed: Aug. 21, 2012

(65) Prior Publication Data

US 2012/0313248 A1 Dec. 13, 2012

Related U.S. Application Data

(60) Continuation of application No. 13/012,438, filed on Jan. 24, 2011, now Pat. No. 8,268,723, which is a division of application No. 12/395,989, filed on Mar. 2, 2009, now Pat. No. 7,898,064, which is a division of application No. 11/219,132, filed on Sep. 1, 2005, now Pat. No. 7,517,798.

(51) Int. Cl.
*H01L 29/40* (2006.01)

(52) U.S. Cl. ............. 257/621; 257/774; 257/E21.476; 257/E21.597

(58) Field of Classification Search .......... 257/621, 257/774, E23.011, E21.597, E21.476
See application file for complete search history.

(56) References Cited

U.S. PATENT DOCUMENTS

| | | |
|---|---|---|
| 4,074,342 A | 2/1978 | Honn et al. |
| 4,445,978 A | 5/1984 | Whartenby et al. |
| 4,806,111 A | 2/1989 | Nishi et al. |
| 5,063,177 A | 11/1991 | Geller et al. |
| 5,166,097 A | 11/1992 | Tanielian |
| 5,229,647 A | 7/1993 | Gnadinger et al. |
| 5,236,551 A | 8/1993 | Pan et al. |
| 5,269,880 A | 12/1993 | Jolly et al. |
| 5,380,681 A | 1/1995 | Hsu et al. |
| 5,420,520 A | 5/1995 | Anschel et al. |
| 5,426,072 A | 6/1995 | Finnila |
| 5,438,212 A | 8/1995 | Okaniwa |
| 5,483,741 A | 1/1996 | Akram et al. |
| 5,495,667 A | 3/1996 | Farnworth et al. |
| 5,528,080 A | 6/1996 | Goldstein |
| 5,541,525 A | 7/1996 | Wood et al. |
| 5,559,444 A | 9/1996 | Farnworth et al. |
| 5,592,736 A | 1/1997 | Akram et al. |
| 5,607,818 A | 3/1997 | Akram et al. |
| 5,686,317 A | 11/1997 | Akram et al. |
| 5,796,264 A | 8/1998 | Farnworth et al. |
| 5,841,196 A | 11/1998 | Gupta et al. |
| 5,843,844 A | 12/1998 | Miyanaga |
| 6,013,948 A | 1/2000 | Akram et al. |

(Continued)

FOREIGN PATENT DOCUMENTS

EP 0926723 A1 6/1999

OTHER PUBLICATIONS

Chu et al., Laser Micromachining of Through Via Interconnects in Active Die for 3-D Multichip Module, IEEE/CMPT Int'l EMT Symposium, 1995, pp. 120-126.

(Continued)

*Primary Examiner* — Angel Roman
(74) *Attorney, Agent, or Firm* — TraskBritt

(57) ABSTRACT

The present invention relates to methods for forming through-wafer interconnects in semiconductor substrates and the resulting structures. In one embodiment, a method for forming a through-wafer interconnect includes providing a substrate having a pad on a surface thereof, depositing a passivation layer over the pad and the surface of the substrate, and forming an aperture through the passivation layer and the pad using a substantially continuous process. An insulative layer is deposited in the aperture followed by a conductive layer and a conductive fill. In another embodiment of the invention, a semiconductor device is formed including a first interconnect structure that extends through a conductive pad and is electrically coupled with the conductive pad while a second interconnect structure is formed through another conductive pad while being electrically isolated therefrom. Semiconductor devices and assemblies produced with the methods are also disclosed.

20 Claims, 10 Drawing Sheets

U.S. PATENT DOCUMENTS

| | | | |
|---|---|---|---|
| 6,018,196 A | 1/2000 | Noddin et al. |
| 6,022,797 A | 2/2000 | Ogasawara et al. |
| 6,054,377 A | 4/2000 | Filipiak et al. |
| 6,080,664 A | 6/2000 | Huang et al. |
| 6,110,825 A | 8/2000 | Mastromatteo et al. |
| 6,114,240 A | 9/2000 | Akram et al. |
| 6,214,716 B1 | 4/2001 | Akram |
| 6,221,769 B1 | 4/2001 | Dhong et al. |
| 6,355,181 B1 | 3/2002 | McQuarrie |
| 6,400,172 B1 | 6/2002 | Akram et al. |
| 6,410,431 B2 | 6/2002 | Bertin et al. |
| 6,410,976 B1 | 6/2002 | Ahn |
| 6,420,209 B1 | 7/2002 | Siniaguine |
| 6,458,696 B1 | 10/2002 | Gross |
| 6,479,382 B1 | 11/2002 | Naem |
| 6,541,280 B2 | 4/2003 | Kaushik et al. |
| 6,620,731 B1 | 9/2003 | Farnworth et al. |
| 6,667,551 B2 | 12/2003 | Hanaoka et al. |
| 6,712,983 B2 | 3/2004 | Zhao et al. |
| 6,716,737 B2 | 4/2004 | Plas et al. |
| 6,770,923 B2 | 8/2004 | Nguyen et al. |
| 6,809,421 B1 | 10/2004 | Hayasaka et al. |
| 6,821,877 B1 | 11/2004 | Han |
| 6,841,883 B1 | 1/2005 | Farnworth et al. |
| 6,844,241 B2 | 1/2005 | Halahan |
| 6,846,725 B2 | 1/2005 | Nagarajan et al. |
| 6,852,621 B2 | 2/2005 | Hanaoka et al. |
| 6,979,652 B2 | 12/2005 | Khan et al. |
| 7,001,825 B2 | 2/2006 | Halahan et al. |
| 7,029,937 B2 | 4/2006 | Miyazawa |
| 7,109,060 B2 | 9/2006 | Fukazawa |
| 7,109,068 B2 | 9/2006 | Akram et al. |
| 7,135,762 B2 | 11/2006 | Yamaguchi |
| 7,199,050 B2 | 4/2007 | Hiatt |
| 7,429,529 B2 | 9/2008 | Farnworth et al. |
| 7,517,798 B2 | 4/2009 | Tuttle |
| 7,898,064 B2 | 3/2011 | Tuttle |
| 2002/0115290 A1 | 8/2002 | Halahan et al. |
| 2002/0148807 A1 | 10/2002 | Zhao et al. |
| 2004/0080040 A1 | 4/2004 | Dotta et al. |
| 2004/0192033 A1 | 9/2004 | Hara |
| 2004/0207089 A1 | 10/2004 | Masuda |
| 2004/0217483 A1 | 11/2004 | Hedler et al. |
| 2005/0006768 A1 | 1/2005 | Narasimhan et al. |
| 2005/0106845 A1 | 5/2005 | Halahan et al. |
| 2005/0121768 A1 | 6/2005 | Edelstein et al. |
| 2005/0136568 A1 | 6/2005 | Fukazawa |
| 2005/0199973 A1 | 9/2005 | Benzel |
| 2006/0043599 A1 | 3/2006 | Akram et al. |
| 2006/0170110 A1 | 8/2006 | Akram et al. |
| 2008/0150089 A1 | 6/2008 | Kwon et al. |
| 2008/0308910 A1 | 12/2008 | Farnworth |

OTHER PUBLICATIONS

Lee et al., Laser Created Silicon Vias for Stacking Dies in MCMs, EMT Symposium, 1991, Tampa, Florida, pp. 262-265.

SEMICONDUCTOR DEVICE STRUCTURES

CROSS-REFERENCE TO RELATED APPLICATIONS

This application is a continuation of U.S. patent application Ser. No. 13/012,438, filed Jan. 24, 2011, now U.S. Pat. No. 8,268,723, issued Sep. 18, 2012, which is a divisional of U.S. patent application Ser. No. 12/395,989, filed Mar. 2, 2009, now U.S. Pat. No. 7,898,064, issued Mar. 1, 2011, which is a divisional of U.S. patent application Ser. No. 11/219,132, filed Sep. 1, 2005, now U.S. Pat. No. 7,517,798, issued Apr. 14, 2009, the disclosure of each of which is hereby incorporated herein by this reference. This application is also related to U.S. Provisional Application Ser. No. 60/606,355, filed Aug. 31, 2004; U.S. patent application Ser. No. 11/138,544, filed May 26, 2005, now U.S. Pat. No. 7,109,068, issued Sep. 19, 2006; U.S. patent application Ser. No. 11/384,069, filed Mar. 17, 2006, now abandoned; U.S. patent application Ser. No. 11/198,338, filed Aug. 5, 2005, now U.S. Pat. No. 7,429,529, issued Sep. 30, 2008; and U.S. patent application Ser. No. 12/186,913, filed Aug. 6, 2008, now U.S. Pat. No. 7,880,307, issued Feb. 1, 2011, the disclosure of each of which is hereby incorporated herein by this reference.

BACKGROUND

1. Field of the Invention

The present invention relates generally to semiconductor manufacturing techniques and methods of forming electrical contacts in semiconductor substrates. More particularly, the present invention relates to methods of forming through-wafer interconnects in semiconductor substrates and structures resulting therefrom.

2. State of the Art

Semiconductor substrates often have vias extending therethrough, wherein the vias are filled with conductive materials to form interconnects (commonly known as a through-wafer interconnect, or "TWI") used, for example, to connect circuitry on one surface of the semiconductor device to circuitry on another surface thereof, or to accommodate connection with external circuitry.

As used herein, a "via" refers to a hole or aperture having conductive material or a conductive member therein and which extends substantially through a substrate (e.g., from one surface substantially to another opposing surface). The via may be used to accommodate electrical connection of a semiconductor device, an electrical component, or circuitry located on a side of the substrate other than where bond pads have been formed. Vias are conventionally formed in a variety of substrates for a variety of uses. For example, interposers for single die packages, interconnects for multi-die packages, and contact probe cards for temporarily connecting semiconductor dice to a test apparatus often employ vias in their structures.

One known method of forming through-wafer interconnect structures includes a process known as spacer etching. Spacer etching is a relatively complicated and costly procedure. Referring to FIGS. 1A-1D a conventional method of forming a through-wafer interconnect using spacer etching is shown. FIG. 1A illustrates a semiconductor device 10 having a substrate 12 (such as a silicon substrate) with a layer of borophosphosilicate glass 14 (BPSG) disposed on a surface thereof. A bond pad 16 is formed over the layer of BPSG 14, and a passivation layer 18 overlies the bond pad 16. The passivation layer 18 is etched, such as by reactive ion (dry) etching, so as to define an opening in the passivation layer 18 at a location above the bond pad 16 as shown in FIG. 1B. Another etching process is used to form a hole or an aperture 20 that extends into the silicon substrate 12 portion of the semiconductor device 10 as shown in FIG. 1C.

As also depicted in FIG. 1C, a layer of insulative material 22 (e.g., a pulsed deposition layer or "PDL") is deposited over the passivation layer 18, the bond pad 16, and an inner surface of the aperture 20. Optionally, a conductive liner may also be coated over the passivation layer 18, the bond pad 16, and an inner surface of the aperture 20. By forming the through-wafer interconnect in this manner, the layer of insulative material 22 is deposited on the exposed portion of bond pad 16 and must be subsequently removed. A spacer etching process may also be used to remove portions of the layer of insulative material 22, wherein portions of the layer of insulative material 22 are left on the inner surface of the aperture 20 and on the passivation layer 18 such as is illustrated in FIG. 1D. A conductive filler 24 is disposed in the aperture 20 and placed in contact with the bond pad 16. The filler 24 is exposed through the back surface of the substrate 12 to form the conductive via, as shown in FIG. 1D and as will be appreciated by those of ordinary skill in the art.

Under some conditions, e.g., the use of polyimide as a passivation layer, the PDL film will form cracks on the surface due to a mismatch in the coefficient of thermal expansion ("CTE") of the materials. The subsequently performed spacer etch will replicate those cracks into the passivation layer ultimately causing shorting when metal is used to coat the sidewalls of the via.

It is a continuing desire to improve the manufacturing techniques and processes used in semiconductor fabrication including those associated with forming TWI structures. It would be advantageous to provide methods of forming through-wafer interconnect structures having improved efficiency and which are more cost effective than conventional techniques such as those which employ conventional spacer etching techniques.

BRIEF SUMMARY

The present invention, in a number of embodiments, includes methods for forming through-wafer interconnects in semiconductor substrates and structures resulting from the methods. The disclosed methods of forming through-wafer interconnects are more efficient, more economical and provide greater flexibility in the manufacturing and design of semiconductor devices in comparison to conventional methods of forming such structures.

In accordance with one embodiment of the present invention, a method for forming a through-wafer interconnect in a substrate includes providing a substrate having a pad on a surface of the substrate and depositing a passivation layer over the pad and the surface of the substrate. The method further includes forming an aperture through the passivation layer, the conductive pad and into the substrate using a substantially continuous process. A dielectric layer is disposed over the passivation layer and the inner surface of the aperture. The dielectric layer is removed from the passivation layer while leaving the dielectric layer on the inner surface of the aperture. The method also includes removing a portion of the passivation layer from the pad to expose a portion of the pad, filling the aperture with a conductive material and contacting the exposed portion of the pad with the conductive material.

In another embodiment, a semiconductor device is described. The semiconductor device includes a substrate having a first surface and an opposing, second surface, wherein the first surface has a pad with a passivation layer disposed thereon. An aperture having an inner surface coated with a dielectric layer extends through the conductive pad. The semiconductor device also includes a conductive layer overlying the dielectric layer, wherein a portion of the conductive layer protrudes from the aperture beyond a surface of the conductive pad.

In yet another embodiment of the present invention, a method of forming a semiconductor device includes providing a substrate having a first surface and a second, opposing surface and at least two conductive pads disposed on the first surface. At least two through-wafer interconnect (TWI) structures are formed including a first TWI structure formed through the first conductive pad and a second TWI structure formed through the second conductive pad. The first TWI structure and the first conductive pad are electrically connected while the second TWI structure is electrically insulated from the second conductive pad.

In accordance with another aspect of the present invention, another semiconductor device is provided. The semiconductor device includes a substrate having a first surface and a second, opposing surface, a first conductive pad disposed on the first surface and a second conductive pad disposed on the first surface. The semiconductor device further includes a plurality of through-wafer interconnect (TWI) structures including a first TWI structure extending through and electrically connected with the first conductive pad and a second TWI structure extending through and electrically insulated from the second conductive pad.

In yet a further embodiment, a method for forming a through-wafer interconnect in a substrate includes providing a substrate having a pad on a surface of the substrate. The method further includes depositing a passivation layer over the pad and the surface of the substrate, and forming an aperture through the passivation layer and the pad. A dielectric layer is deposited over the passivation layer and an inner surface of the aperture. The method further includes removing a portion of the dielectric layer and a portion of the passivation layer, thus exposing a portion of the pad circumscribing the aperture, filling the aperture with a conductive material, and covering the exposed portion of the pad with the conductive material.

Another semiconductor device is disclosed in an additional embodiment. The semiconductor device includes a substrate having a first surface and an opposing, second surface, wherein the first surface has a pad and a passivation layer disposed thereon. An aperture having an inner surface coated with a dielectric layer extends through the pad. In the semiconductor device, an uppermost surface of the dielectric layer is disposed below a lowermost surface of the pad.

In yet a further embodiment, another method of forming a through-wafer interconnect in a substrate includes providing a substrate having a pad on a surface of the substrate and depositing a passivation layer over the pad and the surface of the substrate. An aperture is formed through the passivation layer and the pad. The method also includes depositing a dielectric layer over the passivation layer and an inner surface of the aperture, and filling the aperture with a conductive material.

Assemblies of stacked semiconductor devices including through-wafer interconnects, according to the present invention, are also encompassed thereby.

BRIEF DESCRIPTION OF THE SEVERAL VIEWS OF THE DRAWINGS

In the drawings, which depict exemplary embodiments of various features of the present invention, and in which various elements are not necessarily to scale.

DETAILED DESCRIPTION

The present invention, in a number of embodiments, includes methods for forming through-wafer interconnects that extend into a semiconductor substrate between a first surface of the semiconductor substrate and a second surface thereof, and the resulting structures. The present invention may be used to form so-called "through-wafer interconnects" (TWIs), which may also be referred to as vias, for electrically connecting integrated circuitry of a semiconductor device to integrated circuitry of another semiconductor device, to other electrical devices or in higher level packaging. For instance, in one embodiment, the TWI structures produced using the methods disclosed herein may be formed so as to be electrically connected to a bond pad or other metal structure to allow electrical connection to the integrated circuit and, in another embodiment, the TWI structures may be configured to pass through a bond pad without any electrical connection thereto. Semiconductor devices having the TWI structures produced using the methods disclosed herein may be used, for example, for stacked die assemblies, chip select pads, and the like.

Figure 1A:
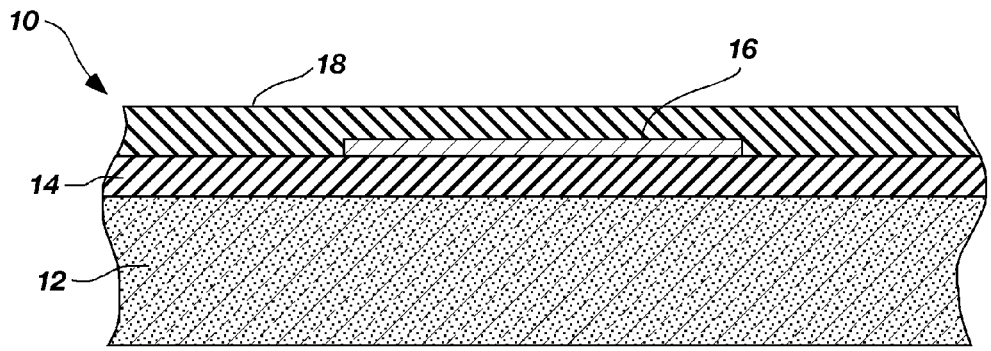
FIGS. 1A-1D are cross-sectional views of a substrate illustrating acts of a conventional method of forming a through-wafer interconnect in a semiconductor device as known in the art.
Figure 1B:
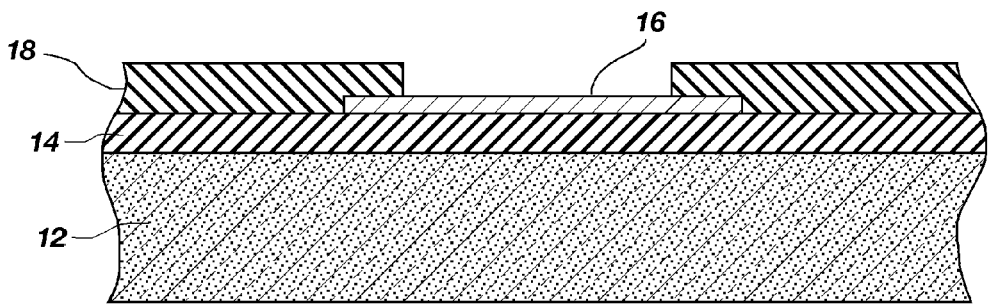
Figure 1C:
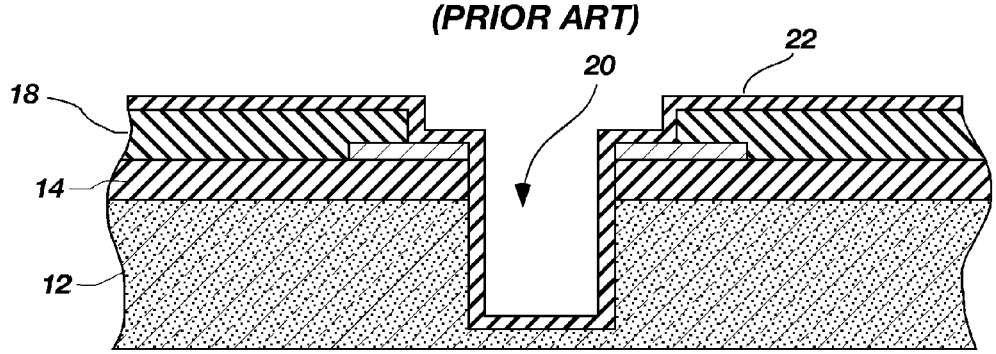
Figure 1D:
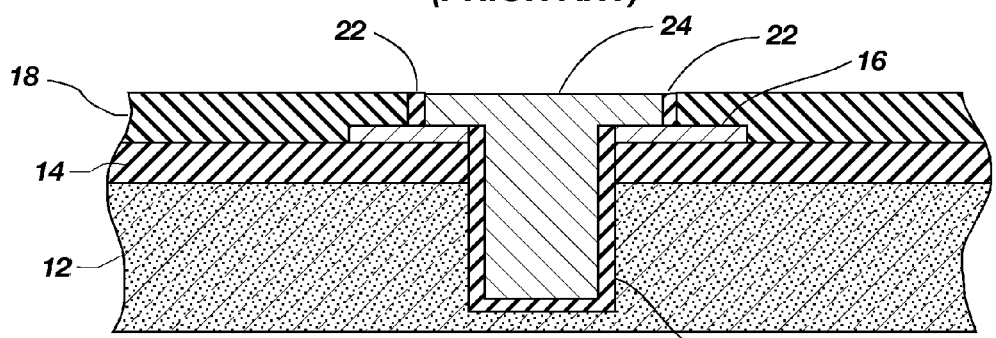
Figure 2:
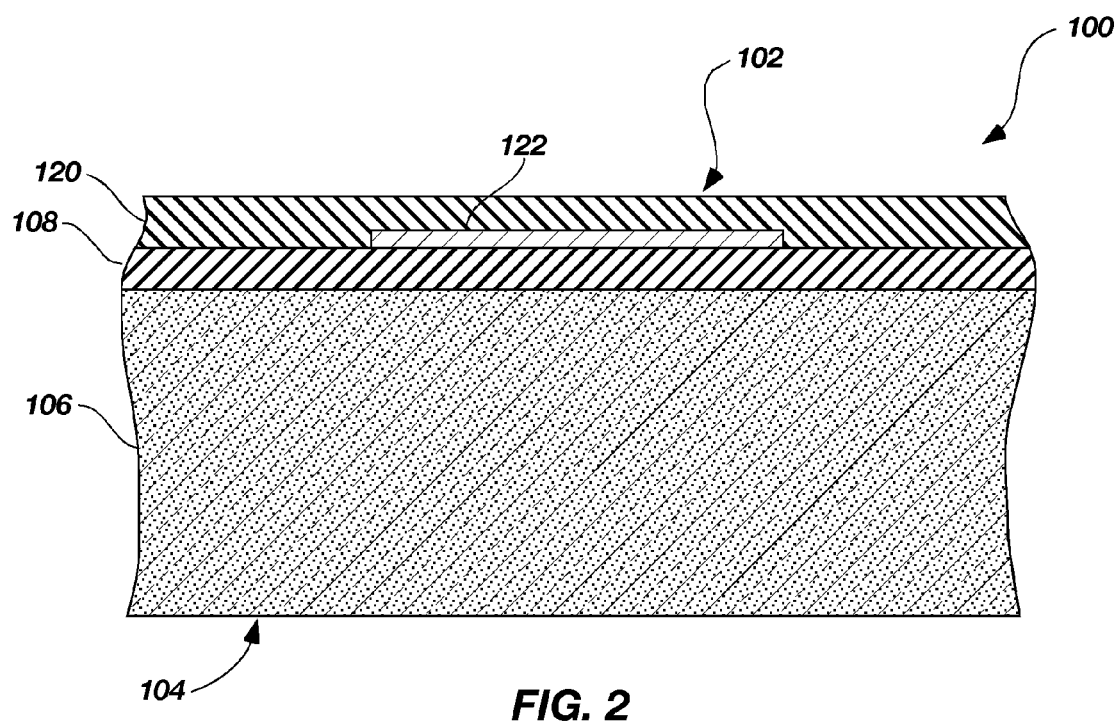
FIG. 2 is a cross-sectional view of a semiconductor device on which one embodiment of a method of forming a through-wafer interconnect is performed.

Referring to FIGS. 2-7, acts in one method of the present invention for forming through-wafer interconnects (TWIs) are disclosed. FIG. 2 illustrates a cross-section of an exemplary semiconductor device 100 having a first surface 102 and an opposing, second surface 104. The semiconductor device 100 includes a semiconductor substrate 106 (e.g., a silicon substrate), a dielectric layer 108 (e.g., borophosphosilicate glass (BPSG)) and a passivation layer 120. A conductive pad or line 122 (e.g., aluminum metal) is disposed on the dielectric layer 108. In one embodiment, the conductive pad 122 may be covered with the passivation layer 120, for example, after the semiconductor device 100 has been subjected to one or more tests by contacting the conductive pad 122 of the semiconductor device 100 with a test probe, as will be appreciated by those of ordinary skill in the art.

The substrate 106 may comprise, without limitation, a bulk semiconductor substrate (e.g., a full or partial wafer of a semiconductor material, such as silicon, gallium arsenide, indium phosphide, polysilicon, a silicon-on-insulator (SOI) type substrate, such as silicon-on-ceramic (SOC), silicon-on-glass (SOG), or silicon-on-sapphire (SOS), etc.), that may include a plurality of semiconductor devices thereof, and, optionally, semiconductor dice. If the substrate 106 is a wafer, the substrate 106 may be a full thickness wafer as received from a vendor or a wafer that has been thinned (e.g., thereby defining the second surface 104), as by back grinding or wet etching, after fabrication of the integrated circuitry of the semiconductor device 100).

The passivation layer 120 may comprise a material other than BPSG, for example, a silicon oxide, silicon nitride, phosphosilicate glass (PSG), borosilicate glass (BSG), or another material, including one of a variety of insulative, organic (polymeric) materials, which are available for passivation. The passivation material may be applied by chemical vapor deposition (CVD), plasma-enhanced chemical vapor deposition (PECVD), or other deposition method suitable for the type of passivation material used. The dielectric layer 108 may also be framed from other dielectric materials such as, by way of example, silicon dioxide or silicon nitride. Although not illustrated, it will be appreciated by those of ordinary skill in the art that the semiconductor device 100 may further include or be further processed to include other conductive elements, active areas or regions, transistors, capacitors, redistribution lines, or other structures comprising the integrated circuitry of semiconductor device 100.

The TWIs of the present invention may be formed at the semiconductor die level or at the wafer (or other bulk substrate) level, depending on the particular needs of the manufacturing process. Thus, while FIGS. 2-8 illustrate the fabrication of a single TWI in association with a single conductive pad 122, it should be understood that the semiconductor device 100 may be constructed to include multiple TWIs and that such TWIs may be associated with internal circuitry (not shown) or may be formed in "dead space" of the substrate 106 wherein no integrated circuitry resides.

Figure 3:
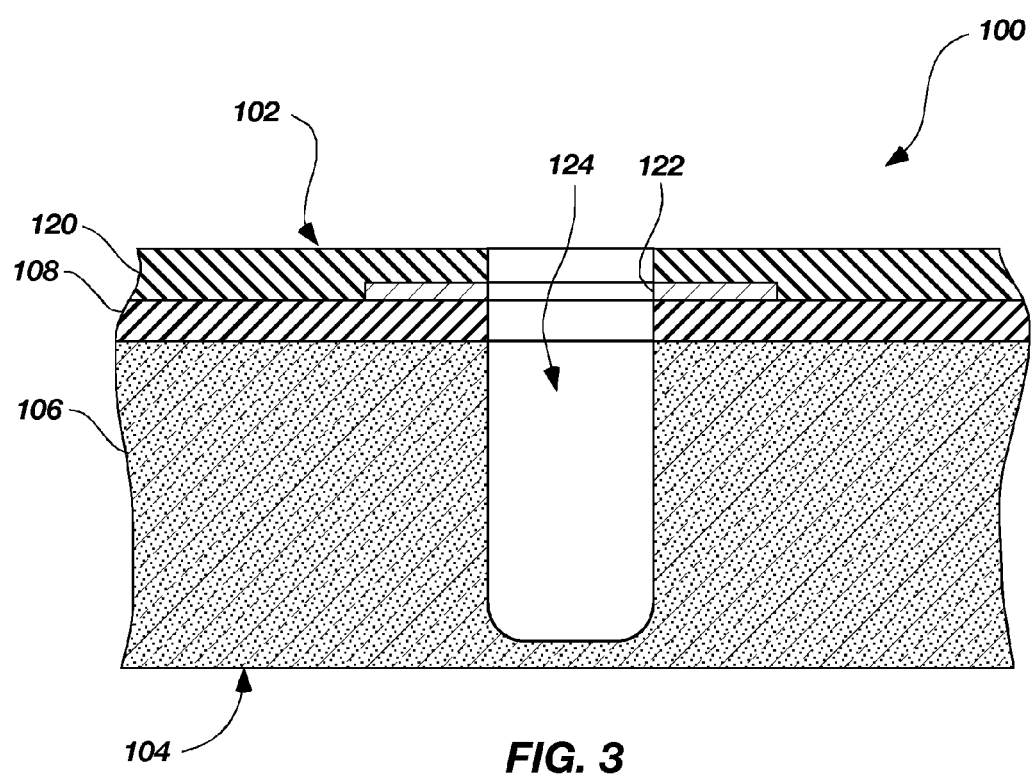
FIG. 3 is a cross-sectional view of the semiconductor device of FIG. 2 having an aperture formed therein.

Referring now to FIG. 3, an aperture 124 is formed as a blind hole in the semiconductor device 100. In one embodiment, the aperture 124 is patterned and etched through the passivation layer 120, the conductive pad 122, the dielectric layer 108 (and any other materials that might be disposed above the substrate 106), and into the substrate 106. The aperture 124 may be formed by appropriately masking and patterning a photoresist or other material (e.g., oxide hard mask) and wet or dry etching to form the aperture 124 to a predetermined depth. For example, in one embodiment, the aperture may be formed to a depth of approximately 200 µm.

One suitable "wet" metal etch employs a mixture of nitric acid and hydrofluoric (HF) acid in deionized (DI) water. "Dry" etching may also be termed reactive ion etching (RIE). Either a wet or a dry etchant may be used to etch through the passivation layer 120, the conductive pad 122 and the dielectric layer 108 to form the aperture 124. In other embodiments, the aperture 124 may be formed by mechanical drilling, or use of an electromagnetic device such as a laser for laser ablation of the material of substrate 106. After formation, the aperture 124 may be subjected to a cleaning process to remove any unwanted reactants or impurities formed during the aperture formation process or, in the case of laser ablation, to remove heat-damaged portions of substrate 106 surrounding the aperture 124 and comprising a so-called "heat affected zone." One suitable cleaning solvent for such purpose is a 6% tetramethyl ammonium hydroxide (TMAH) in propylene glycol solution.

Figure 4:
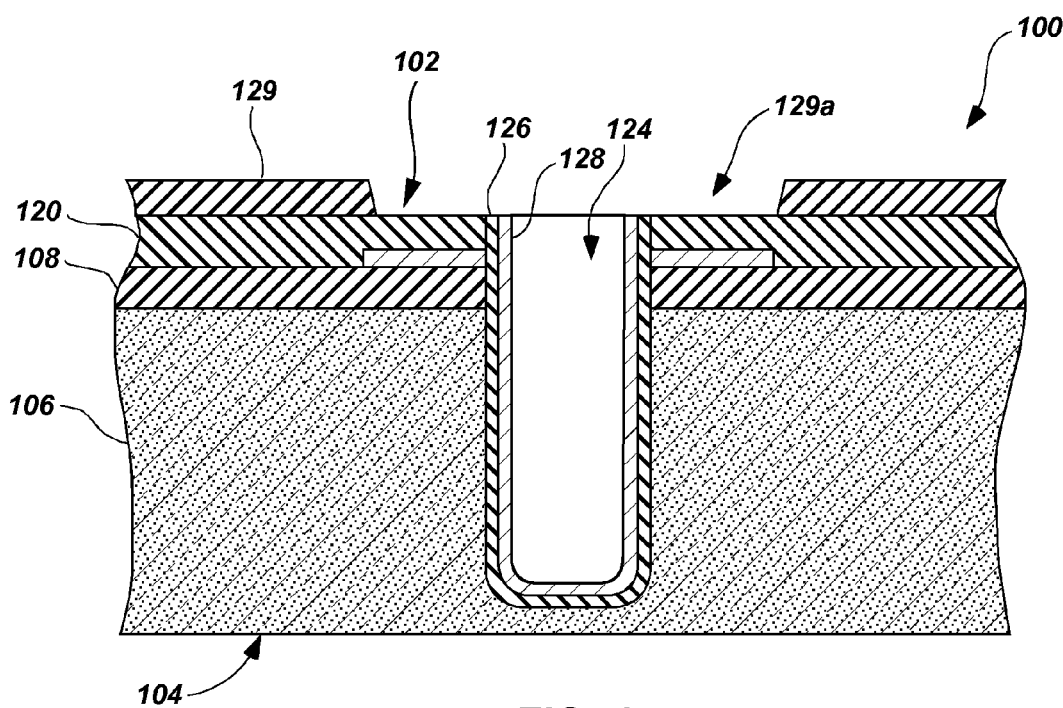
FIG. 4 is a cross-sectional view of the semiconductor device of FIG. 3 having an insulative layer and a conductive liner formed in the aperture.

Referring now to FIG. 4, an insulative layer 126 is deposited on an inner surface of the aperture 124 and over the first surface 102 of the semiconductor device 100. A conductive layer 128 is subsequently disposed on the inner surface of the aperture 124 and the first surface 102 of the semiconductor device 100. The insulative layer 126 and the conductive layer 128 may be removed from the first surface 102 by chemical-mechanical polishing (CMP), as shown in FIG. 4, in a manner such that the insulative layer 126 and the conductive layer 128 remain on the inner surfaces of the aperture 124. In another embodiment, CMP may be used to remove the conductive layer 128 from the first surface 102 of the semiconductor device 100 while the insulative layer 126 is left in place on the first surface 102 of the semiconductor device 100 (not shown). In yet an additional embodiment, the aperture 124 may be filled with a polymer or a nickel (Ni) plate and solder in order to enable easier and more efficient CMP processing, and protection of the inner surface of the aperture 124 during the CMP process.

The insulative layer 126 may comprise a dielectric material such as, for example, a pulsed deposition layer (PDL), low silane oxide (LSO), PARYLENE™ polymer such as that which is available from Specialty Coating Systems division of Cookson Electronics of Providence, R.I., silicon dioxide ($SiO_2$), aluminum oxide ($Al_2O_3$), an organic polymeric material suitable for passivation purposes such as polybenzoxazole (PBO) or benzocyclobutene (BCB), or combinations of any thereof. Other dielectric materials that may be used as the insulative layer 126 include tetraethyl orthosilicate (TEOS), spin-on glass, thermal oxide, a pulse deposition layer comprising aluminum rich oxide, silicon nitride, silicon oxynitride, a glass (i.e., borophosphosilicate glass (BPSG), phosphosilicate glass, borosilicate glass), or any other suitable dielectric material known in the art. Methods of depositing the insulative layer 126 are known by those of ordinary skill in the art and may vary depending on the type of material used for the insulative layer 126.

In one embodiment, the conductive layer 128 may include another layer such as a plating-attractive coating (PAC) or some type of seed layer that is placed over the insulation layer 126 to enhance the deposition of the conductive layer 128. For instance, titanium nitride (TiN) may be placed over the insulation layer 126 using chemical vapor deposition (CVD) techniques to act as the PAC for the subsequent deposition of the seed layer with a plating process such as, for example, electroless or electrolytic plating to form the conductive layer 128.

Other conductive materials that may be used to form the conductive layer 128 include, without limitation, titanium (Ti), polysilicon (Si), palladium (Pd), tin (Sn), tantalum (Ta), tungsten (W), cobalt (Co), copper (Cu), silver (Ag), aluminum (Al), iridium (Ir), gold (Au), molybdenum (Mo), platinum (Pt), nickel-phosphorus (NiP), palladium-phosphorus (Pd—P), cobalt-phosphorus (Co—P), a cobalt-tungsten-phosphorous (Co—W—P) alloy, other alloys of any of the foregoing metals, a conductive polymer or conductive material entrained in a polymer (i.e., conductive or conductor-filled epoxy) and mixtures of any thereof.

Other deposition processes that may be used to deposit the various layers of the conductive layer 128 include metallo-organic chemical vapor deposition (MOCVD), physical vapor deposition (PVD), plasma-enhanced chemical vapor deposition (PECVD), vacuum evaporation and sputtering. It will be appreciated by those of ordinary skill in the art that the type and thickness of material of the various layers or materials used for the conductive layer 128 and the deposition processes used to deposit the layers of the conductive layer 128 will vary depending on, for example, the electrical requirements and the type of desired material used to faun the TWI and the intended use of the TWI.

Figure 5:
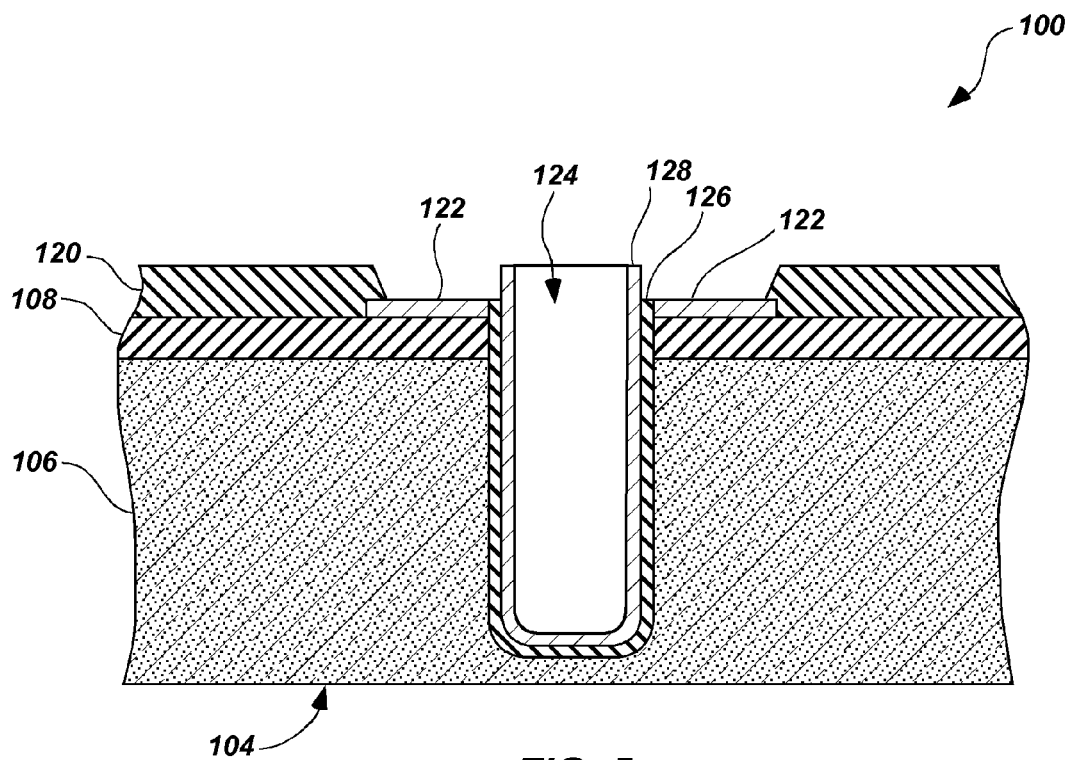
FIG. 5 is a cross-sectional view of the semiconductor device of FIG. 4 having a portion of a passivation layer removed to partially expose a bond pad.

Referring now to FIG. 5, a portion of the passivation layer 120 overlying the conductive pad 122 is removed such as by using a conventional photolithographic patterning and etching process to form an opening over and at least partially expose the conductive pad 122. For instance, a mask 129 (FIG. 4) of a photoresist material may be disposed, patterned and developed on the passivation layer 120 and a suitable etchant may be used to remove the portion of the passivation layer 120 exposed through an aperture 129*a* (FIG. 4) in the mask 129 and form an opening above the conductive pad 122. Further, a portion of the insulative layer 126 contacting the conductive layer 128 and above the conductive pad 122 may or may not be removed depending on the type of etchant used. As illustrated in FIG. 5, the portion of the insulative layer 126 above the conductive pad 122 has been removed to enable easier connection of the conductive pad 122 to the resulting TWI. In another embodiment, the portion of the conductive layer 128 protruding above the conductive pad 122 may be removed such as, for example, with CMP. In another embodiment, since the conductive layer 128 may be used to protect the insulative layer 126 during an etching process, the conductive layer 128 may also be applied over the conductive pad 122 and the insulative layer 126 after the conductive pad 122 has been exposed (i.e., after the acts described with reference to FIG. 5).

Figure 6:
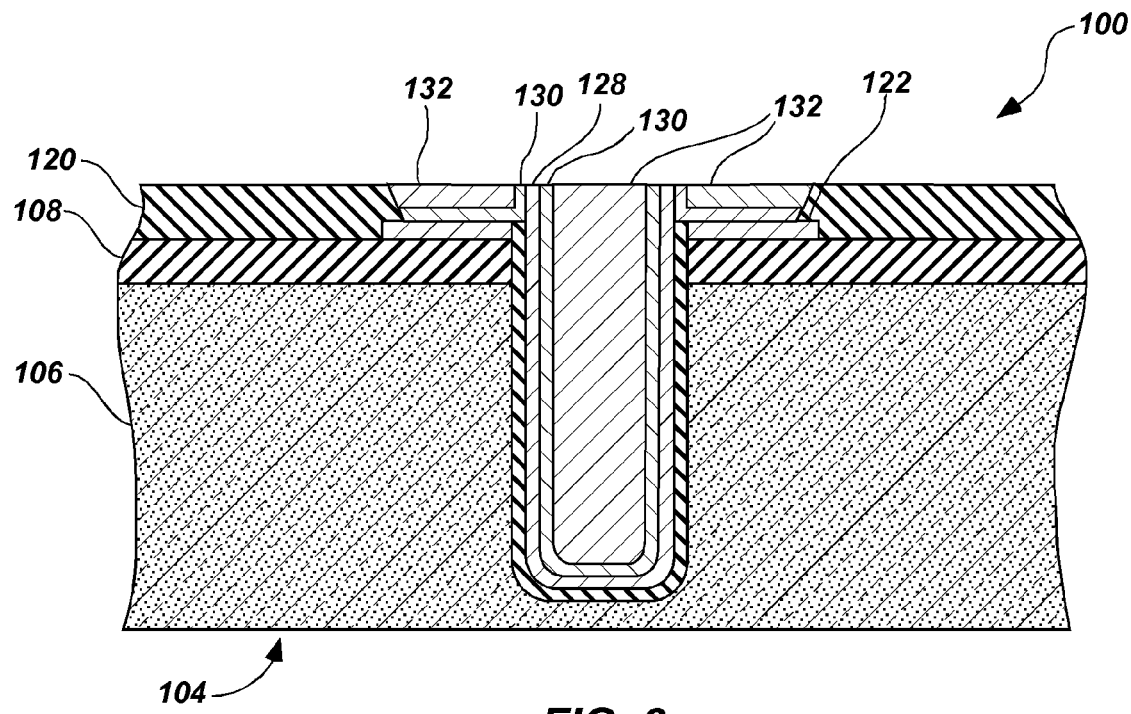
FIG. 6 is a cross-sectional view of a through-wafer interconnect formed in the semiconductor device of FIG. 5 prior to exposing the interconnect structure through a backside surface of the substrate.

Turning now to FIG. 6, a metal layer 130 is deposited on the conductive pad 122, the inner surface of the aperture 124 (i.e., the inner surface of the conductive layer 128), and the external surface of the portion of the conductive layer 128 protruding above the conductive pad 122. In one embodiment, the metal layer 130 may include a nickel and may be deposited by electroless or electrolytic plating. In another embodiment, the metal layer 130 of nickel may be coated with a further copper layer. In other embodiments, the metal layer 130 may comprise tantalum or copper, and may be deposited by physical vapor deposition (PVD).

After deposition of the metal layer 130, the remaining portion of the aperture 124 and the defined openings above the conductive pad 122 are filled with a conductive material 132 such as, for example, solder. In one embodiment, the solder may be applied with a wave solder process. In other embodiments, the aperture 124 and the volume above the conductive pad 122 may be filled with other conductive materials 132, which may comprise a metal, metal powder, a metal or alloy powder, a flowable conductive photopolymer, a thermoplastic conductive resin, resin-covered particulate metal material, or other suitable material that may be used to form a solid, conductive TWI.

Figure 7:
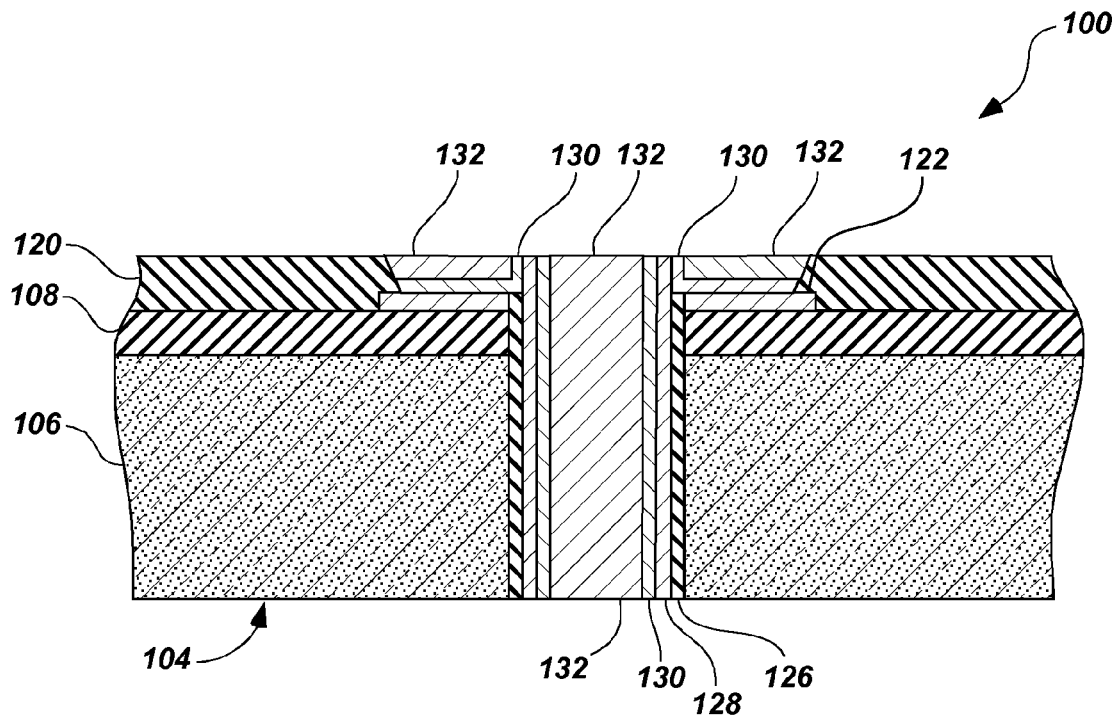
FIG. 7 is a cross-sectional view of a through-wafer interconnect with the interconnect structure being exposed through both surfaces of the semiconductor device.

As shown in FIG. 7, CMP, conventional back grinding or another known mechanical or chemical process may be used to complete the TWI structure by exposing the conductive material 132 through the second surface 104 of the substrate 106 for subsequent connection to, for example, circuitry of an external component. The resulting TWI structure is connected to the conductive pad 122 by way of the conductive material 132 and the conductive layer 128.

It is noted that, by using the process of the presently described embodiment, only two etch procedures using a mask are employed; once to form the aperture 124 described with respect to FIG. 3 and then again to define the opening above the conductive pad 122 as seen in FIG. 5. The prior art process described herein with reference to FIGS. 1A-1D uses an etching process three different times. For instance, etching is used to open the bond pad 16, again to form the aperture 20, and spacer etching is finally used to remove the layer of insulative material 22 as previously described herein. Thus, the process of the instant invention is more efficient than the conventional process of spacer etching as described with respect to FIGS. 1A-1D.

Figure 8:
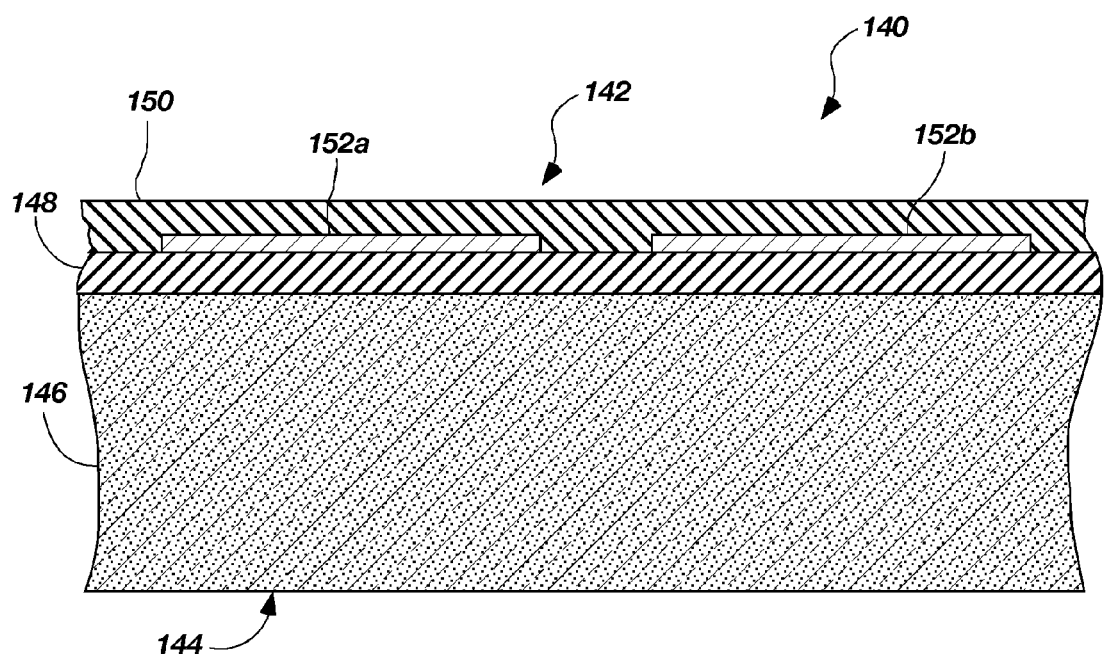
FIG. 8 depicts a cross-sectional view of a semiconductor device in which a through-wafer interconnect is formed in accordance with another embodiment of the present invention.

Referring now to FIGS. 8-15, acts associated with a method of forming through-wafer interconnects (TWIs) in accordance with another embodiment of the present invention are disclosed. It is noted that various aspects of the presently described embodiment may be combined with aspects of other embodiments described herein as will be appreciated by one of ordinary skill in the art. FIG. 8 illustrates a cross-section of an exemplary semiconductor device 140 having a first surface 142 and an opposing, second surface 144. The semiconductor device 140 includes a substrate 146 (e.g., a silicon substrate), a dielectric layer 148 (e.g., BPSG), and a passivation layer 150. Two conductive pads 152*a* and 152*b* (e.g., aluminum metal) are disposed on the dielectric layer 148. In one embodiment, the conductive pads 152*a* and 152*b* are covered by the passivation layer 150 after the semiconductor device 140 has been subjected to one or more tests by contacting the conductive pads 152*a* and 152*b* with test probes.

The substrate 146 may comprise, without limitation, a bulk semiconductor substrate (e.g., a full or partial wafer of a semiconductor material, such as silicon, gallium arsenide, indium phosphide, polysilicon, a silicon-on-insulator (SOI) type substrate, such as silicon-on-ceramic (SOC), silicon-on-glass (SOG), or silicon-on-sapphire (SOS), etc.) that may include a plurality of semiconductor devices thereof, and, optionally, semiconductor dice. If the substrate 146 is a wafer, the substrate 146 may also be a full thickness wafer as received from a vendor or a wafer that has been thinned (e.g., thereby defining the second surface 144) after fabrication of the semiconductor device 140).

The dielectric layer 148 may be formed from materials such as, by way of example, silicon dioxide or silicon nitride. Although not illustrated, it will be appreciated by those of ordinary skill in the art that the semiconductor device 140 may include or be further processed to include other conductive elements, active areas or regions, transistors, capacitors, redistribution lines, or other structures used to produce integrated circuitry.

Referring to FIG. 8, it may be desired that, for example, conductive pad 152a is to be ultimately electrically connected to the TWI that is to be formed in association therewith while conductive pad 152b is not to be electrically connected to the TWI that is to be formed in association with conductive pad 152b. For example, in some stacked chip configurations, it may be desirable to have a TWI that passes through one of the stacked chips without electrically connecting to a bond pad of the chip. It will further be appreciated that the semiconductor device 140 may be configured with any number of TWIs, which are either electrically connected to a conductive pad (i.e., as with conductive pad 152a) or not electrically connected to conductive pads (i.e., as with conductive pad 152b) as well as various combinations thereof.

Figure 9:
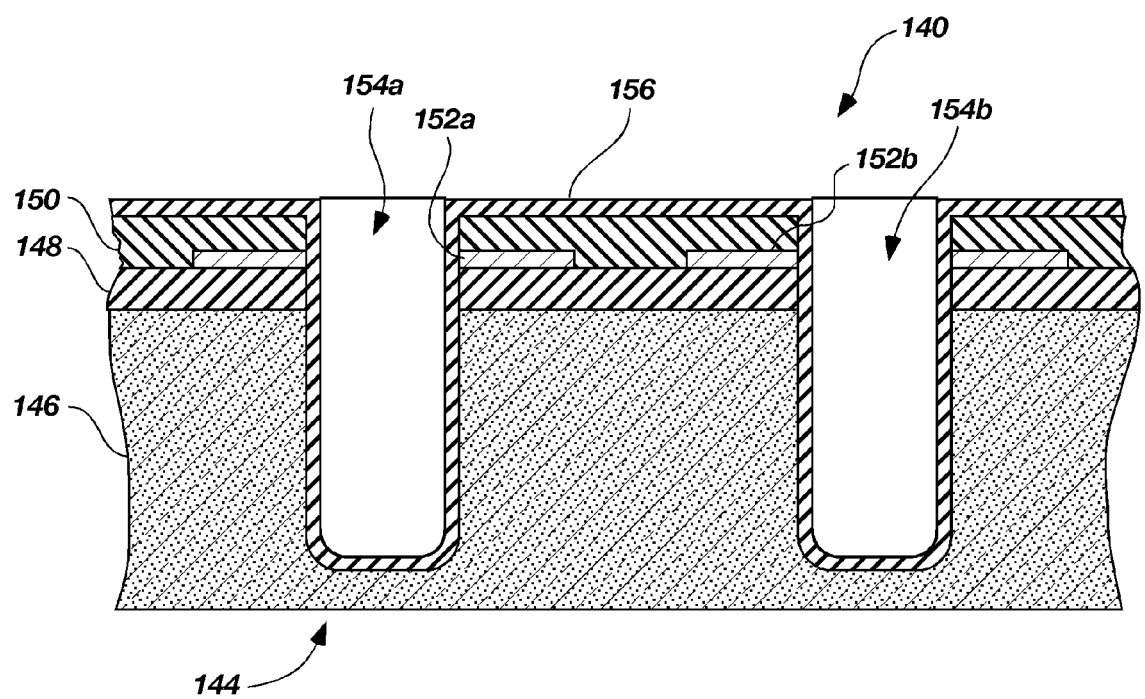
FIG. 9 is a cross-sectional view of the semiconductor device of FIG. 8 having apertures formed therein.

FIG. 9 illustrates the semiconductor device 140 having apertures 154a and 154b formed therein. The apertures 154a and 154b may be formed by patterning and etching through the passivation layer 150, the conductive pads 152a and 152b, the dielectric layer 148 (and any other materials disposed over the substrate 146), and into the substrate 146. The apertures 154a and 154b may be formed by appropriately masking and patterning a photoresist or other material (e.g., hard oxide mask) and wet or dry etching to form the apertures 154a and 154b to a desired depth such as, for example, about 200 µm. One suitable "wet" metal etch employs a mixture of nitric acid and hydrofluoric (HF) acid in deionized (DI) water.

In other embodiments, the apertures 154a and 154b may be formed by mechanical drilling, or use of an electromagnetic device such as a laser for laser ablation. After formation, the apertures 154a and 154b may further be subjected to a cleaning process to remove any unwanted reactants, impurities or damaged substrate material resulting from the aperture formation process.

After formation of the apertures 154a and 154b, any mask used to pattern and etch the apertures 154a and 154b is stripped away and a dielectric layer 156 is deposited on the inner surfaces of the apertures 154a and 154b and over the passivation layer 150. The dielectric layer 156 may comprise a dielectric material such as, for example, LSO, PARYLENE™, silicon dioxide ($SiO_2$), aluminum oxide ($Al_2O_3$), TEOS, or combinations of any and may be deposited using known techniques.

Figure 10:
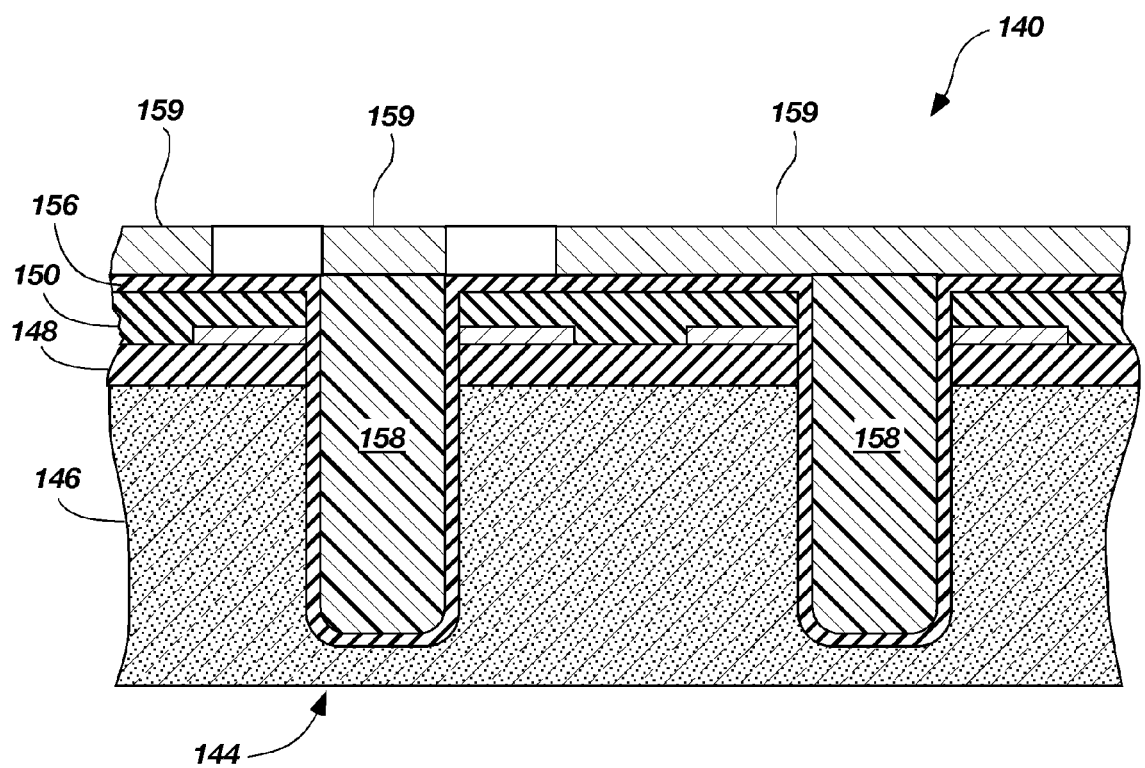
FIG. 10 is a cross-sectional view of the semiconductor device of FIG. 9 having a resist plug, resist layer and mask formed thereon.
Figure 11:
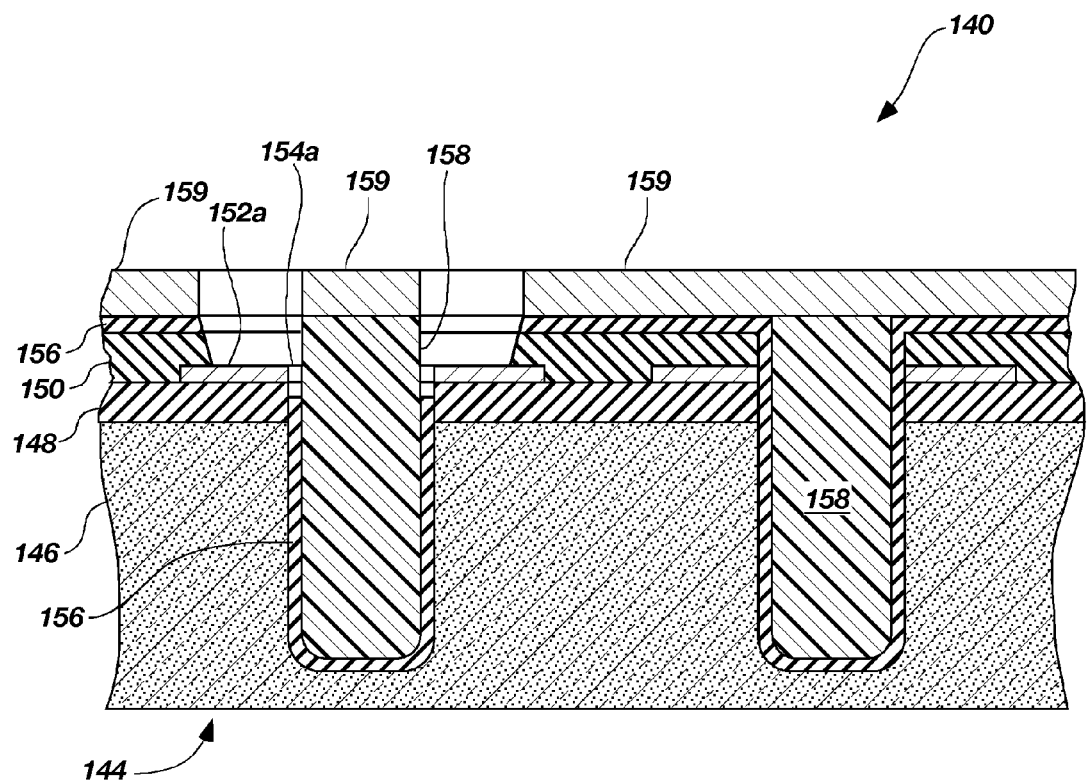
FIG. 11 illustrates a cross-sectional view of the semiconductor device of FIG. 10 with a portion of a pad exposed.

Referring to FIG. 10, after the dielectric layer 156 is deposited, the apertures 154a and 154b are filled with a resist plug 158 such as, for example, by disposing a polymer resist in the apertures 154a and 154b and curing the polymer. A mask 159 is then patterned on the structure. In order to form a TWI that is connected to the conductive pad 152a, an opening (such as, for example, an annular opening as illustrated) is defined over the conductive pad 152a to expose the conductive pad 152a such as by patterning with the mask 159 and etching with a selective etchant that is capable of etching away or removing the dielectric layer 156 and the passivation layer 150 overlying the conductive pad 152a such as is shown in FIG. 11. The selective etchant exposes a portion of the conductive pad 152a and also removes a portion of the dielectric layer 156 circumscribing the resist plug 158, such that an uppermost surface of the dielectric layer 156 disposed in the aperture 154a is slightly recessed below a lowermost surface of the conductive pad 152a.

Figure 12:
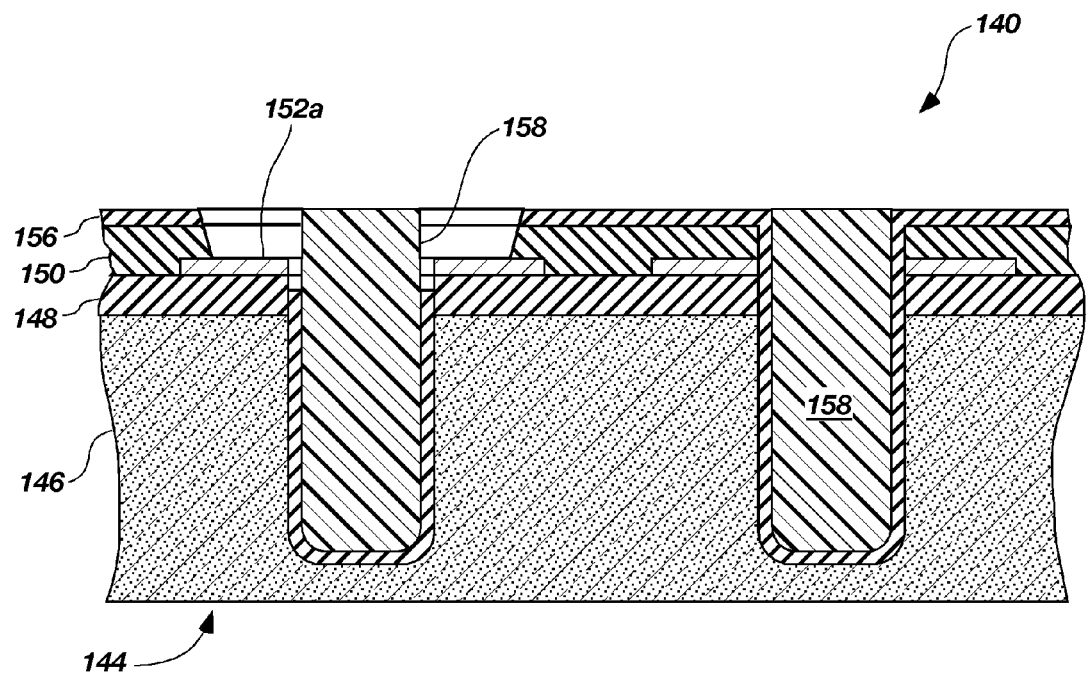
FIG. 12 is a cross-sectional view of the semiconductor device of FIG. 11 after acts of a method of forming the through-wafer interconnects have been performed.

The mask 159 is then stripped away, resulting in the semiconductor device 140 shown in FIG. 12. Such a process enables a later deposited conductive layer to electrically connect the conductive pad 152a to a conductive material deposited in the aperture 154a. In another embodiment, the acts of opening the conductive pad 152a and aperture 154a formation may be reversed in sequence, wherein defining the opening above the conductive pad 152a occurs first, followed by the formation of the aperture 154a.

Figure 13:
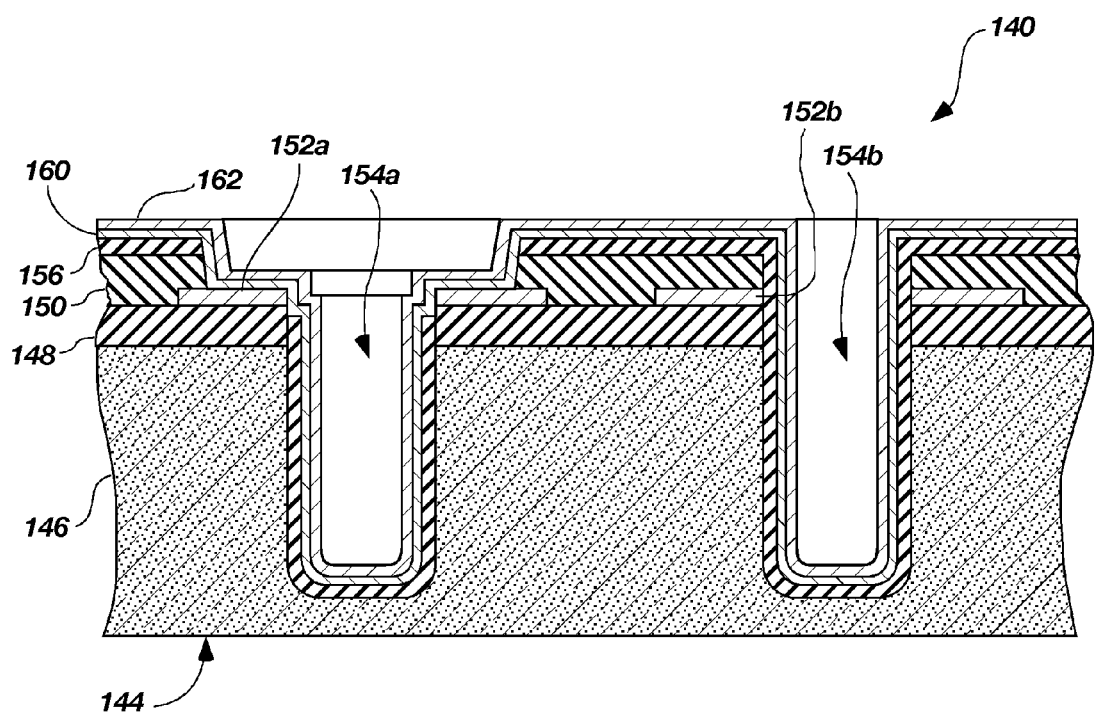
FIG. 13 is a cross-sectional view of the semiconductor device of FIG. 12 after additional acts of the methods of forming the through-wafer interconnects have been performed.

Referring now to FIG. 13, the resist plugs 158 (FIG. 12) are removed by appropriate stripping and a seed layer 160 is deposited over exposed surfaces of the semiconductor device 140. In one embodiment, the seed layer 160 is deposited with atomic layer deposition (ALD) techniques to form a layer of tungsten (W) as the seed layer 160. In other embodiments, the seed layer 160 may comprise tantalum (Ta) or copper (Cu) and be deposited with physical vapor deposition (PVD) techniques, or the seed layer 160 may comprise copper (Cu) or nickel (Ni) and be deposited with electroplating. In another embodiment, a solder wettable material layer 162 may be deposited over the seed layer 160 with an electroless or electroplating method. The solder wettable material layer 162 may comprise nickel (Ni) or other solder-wettable metals.

Figure 14:
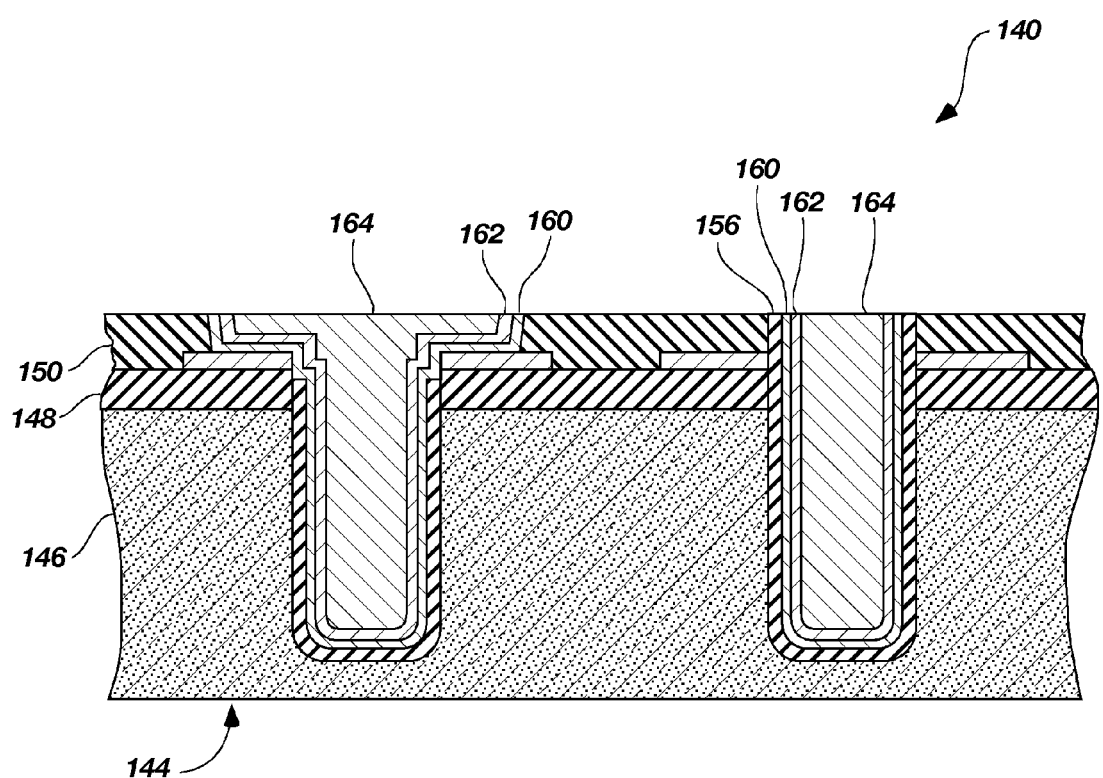
FIG. 14 is a cross-sectional view of a semiconductor device having two through-wafer interconnects formed therein prior to exposing the interconnect structure through a backside surface of the substrate.

As shown in FIG. 14, a conductive material 164 such as, for example, solder is deposited over the solder wettable material layer 162 by plating, dipping the semiconductor device 140 in molten solder or other known conductive material deposition techniques. The conductive material 164 adheres to the majority of the exposed surfaces of the solder wettable material layer 162 and, thus, after deposition of the conductive material 164, an abrasive technique such as CMP or another appropriate process may be used to remove the conductive material 164, the solder wettable material layer 162, and the seed layer 160 extending laterally between the two TWIs to prevent the various conductive materials of one TWI to be connected with those of another TWI and, therefore, preventing any shorting therebetween. The CMP process may further be used to remove the dielectric layer 156 and expose the passivation layer 150 as a flat, controlled surface. In other embodiments, other conductive materials may be used to fill the apertures 154a and 154b to produce a conductive pathway in the TWIs. Other techniques that enable filling of the apertures 154a and 154b with other conductive filler materials, such as a metal or alloy, include physical vapor deposition (PVD), electroplating, or electroless plating. A solder paste may also be placed in the apertures 154a and 154b and reflowed. Further, a conductive or conductor-filled epoxy may be used.

In yet an additional embodiment, an abrasive process such as CMP may be performed to remove the solder wettable material layer 162 and the seed layer 160 from the passivation layer 150 before the conductive material 164 is deposited. In such an embodiment, a CMP process will again be used to remove any excess conductive material 164 in order to expose the passivation layer 150 as a flat, controlled surface.

Figure 15:
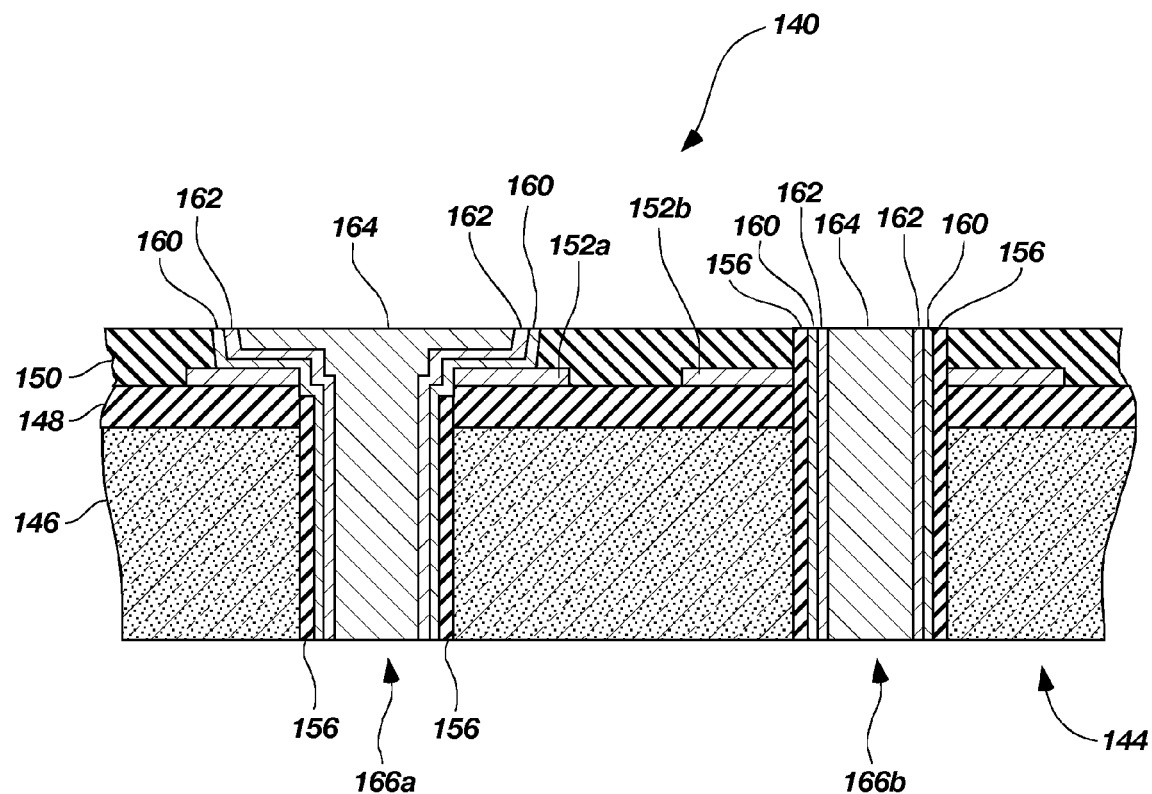
FIG. 15 is a cross-sectional view of a through-wafer interconnect with the interconnect structure being exposed through both surfaces of the semiconductor device.

Referring to FIG. 15, TWI structures 166a and 166b are completed with the thinning of the substrate 146, such as by CMP, conventional back grinding or another appropriate process to expose the conductive material 164 through the second surface 144 of the semiconductor device 140.

The methods described may be used to form a TWI structure 166a that is connected to an adjacent conductive pad 152a as well as a TWI structure 166b that is not electrically connected to an adjacent conductive pad 152b. The TWI structure 166b adjacent the conductive pad 152b that is not electrically connected to the conductive material 164 goes through substantially the same acts as the TWI structure 166a having the conductive pad 152a that is electrically connected to the conductive material 164. However, as seen in FIGS. 10-12, an opening is not defined over the conductive pad 152b. Thus, the insulative layer 156 remains between and electrically isolates the conductive pad 152b from the conductive layers 160 and 162 and the conductive material 164 as illustrated in FIGS. 13-15.

The semiconductor device 140 may further be configured with a redistribution layer comprising traces and, optionally, associated discrete external conductive elements thereon such as solder bumps, which may be formed on either or both of the surfaces 142 or 144 and electrically interconnected with the TWI structures 166a and 166b, as will be appreciated by those of ordinary skill in the art.

Figure 16A:
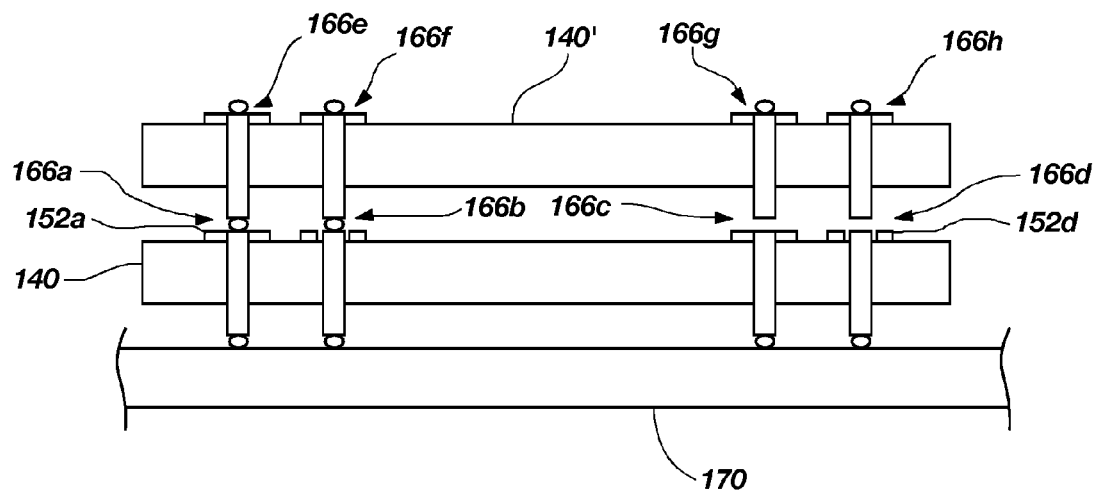
FIG. 16A is a schematic view of one embodiment of a PC board in a stacked arrangement with semiconductor devices having through-wafer interconnects produced with the methods of the present invention.
Figure 16B:
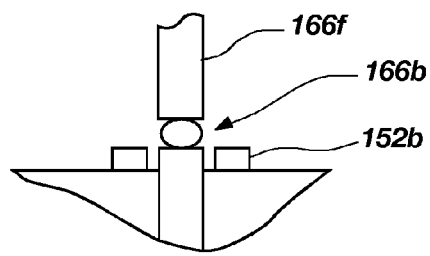
FIGS. 16B and 16C are enlarged views of various portions of the stacked arrangement shown in FIG. 16A.
Figure 16C:
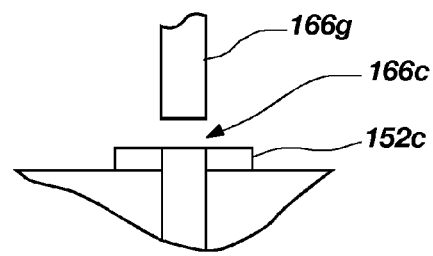

As noted above, after formation of TWI structures 166a or 166b, the TWI structures 166a or 166b may be exposed on the second surface 144 of the semiconductor device 140 using CMP or other known processes in order to prepare the TWI structures 166a or 166b for subsequent connection to integrated circuitry, if desired. For instance, FIG. 16A illustrates one embodiment of a higher level packaging system including TWIs produced with one or more of the methods of the instant invention. For example, a PC board 170, having a first semiconductor device 140 and a second semiconductor device 140' in a stacked arrangement is depicted. The first semiconductor device 140 may be configured with TWI structures 166a-166d and the second semiconductor device 140' may be configured with TWI structures 166e-166h. Use of such TWI structures 166a-166h provides substantial flexibility in designing and fabricating semiconductor devices and related assemblies. For example, referring to FIG. 16B, TWI structure 166f of the second semiconductor device 140' is electrically coupled with TWI structure 166b of the first semiconductor device 140 (such as by a conductive bump, solder ball, or other appropriate structure). TWI structure 166b is not electrically coupled to the conductive pad (or line) 152b. Referring to FIG. 16C, the assembly also includes a TWI structure 166g (of the second semiconductor device 140') that is not connected to an adjacent TWI structure 166c (of the first semiconductor device 140). TWI structure 166c is, however, coupled with its associated conductive pad (or line) 152c.

Of course other configurations may be utilized wherein, for example, a TWI structure is connected to an associated bond pad (or line) and an adjacent TWI structure (e.g., the arrangement represented by TWI structure 166a, conductive pad 152a and TWI structure 166e); or wherein a TWI structure is not coupled to either of an associated bond pad (or line) or an adjacent TWI structure (e.g., the arrangement represented by TWI structure 166d, conductive pad 152d and TWI structure 166h).

Although the foregoing description contains many specifics, these are not to be construed as limiting the scope of the present invention, but merely providing certain exemplary embodiments. Similarly, other embodiments of the invention may be devised that do not depart from the spirit or scope of the present invention. For example, it is noted that various materials, techniques and features discussed with respect to one embodiment described herein may be utilized in conjunction with another embodiment described herein. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A semiconductor device comprising:
   a substrate having a first surface and a second, opposing surface;
   a first conductive pad disposed on the first surface;
   a second conductive pad disposed on the first surface;
   a plurality of through-wafer interconnect (TWI) structures including a first TWI structure extending through and electrically connected with the first conductive pad and a second TWI structure extending through and electrically insulated from the second conductive pad.

2. The semiconductor device of claim 1, wherein the substrate comprises a semiconductor material selected from the group consisting of silicon, gallium arsenide, indium phosphide, polysilicon, silicon-on-ceramic, silicon-on-glass, silicon-on-sapphire, and combinations of any thereof.

3. The semiconductor device of claim 1, further comprising a passivation material over the first surface of the substrate.

4. The semiconductor device of claim 3, wherein the passivation material comprises a material selected from the group consisting of silicon oxide, silicon nitride, phosphosilicate glass (PSG), borosilicate glass (BSG), and an organic polymeric material.

5. The semiconductor device of claim 4, further comprising dielectric material between the passivation material and the first surface of the substrate and under the first conductive pad and the second conductive pad.

6. The semiconductor device of claim 5, wherein the dielectric material comprises borophosphosilicate glass, a silicon oxide, or silicon nitride.

7. The semiconductor device of claim 1, wherein the first TWI structure includes:
   an insulative material over a surface of a first aperture between the first surface and the second, opposing surface;
   at least one conductive layer over the insulative material over the surface of the first aperture and at least partially over and in electrical communication with the first conductive pad; and
   a conductive material filling the first aperture.

8. The semiconductor device of clam 7, wherein the insulative material over the surface of the first aperture is selected from the group consisting of LSO, a PARYLENE™ polymer, silicon dioxide, aluminum oxide, TEOS, polybenzoxazole (PBO), benzocyclobutene (BCB) and combinations of any of the foregoing.

9. The semiconductor device of claim 7, wherein the second TWI structure includes:
   insulative material over a surface of a second aperture extending between the first surface and the second, opposing surface;
   at least one conductive layer over the insulative material over the surface of the second aperture and electrically insulated from the second conductive pad; and
   a conductive material filling the second aperture.

10. The semiconductor device of clam 9, wherein the insulative material over the surface of the first aperture is selected from the group consisting of LSO, a PARYLENE™ polymer, silicon dioxide, aluminum oxide, TEOS, polybenzoxazole (PBO), benzocyclobutene (BCB) and combinations of any of the foregoing.

11. The semiconductor device of claim 9, wherein the conductive material in the first aperture and the conductive material in the second aperture are exposed through the second, opposing surface in the substrate.

12. The semiconductor device of claim 11, wherein the at least one conductive layer over the surface of the first aperture and the at least one conductive layer over the surface of the second aperture each comprises a seed layer.

13. The semiconductor device of claim 12, wherein the seed layer is selected from the group consisting of tungsten (W), tantalum (Ta), copper (Cu), nickel (Ni and titanium nitride (TiN).

14. The semiconductor device of claim 12, wherein the at least one conductive layer over the surface of the first aperture and the at least one conductive layer over the surface of the second aperture each further comprises a solder-wettable material layer.

15. The semiconductor device of claim 14, wherein the solder-wettable material comprises nickel.

16. The semiconductor device of claim 15, wherein the conductive material filling the first aperture and the second aperture comprises a solder.

17. The semiconductor device of claim 9, wherein the conductive material filling the first aperture and the conductive material filling the second aperture is selected from the group consisting of a metal, an alloy other than a solder, a solder alloy, a solder paste, a conductive epoxy and a conductor-filled epoxy.

18. The semiconductor device of claim 9, wherein the at least one conductive layer of the first aperture and the at least one conductive layer of the second aperture are selected from the group consisting of titanium (Ti), polysilicon (Si), palladium (Pd), tin (Sn), tantalum (Ta), tungsten (W), cobalt (Co), copper (Cu), silver (Ag), aluminum (Al), iridium (Ir), gold (Au), molybdenum (Mo), platinum (Pt), nickel-phosphorus (NiP), palladium-phosphorus (Pd—P), cobalt-phosphorus (Co—P), a cobalt-tungsten-phosphorous (Co—W—P) alloy, other alloys of any of the foregoing metals, a conductive polymer or conductive material entrained in a polymer and mixtures of any thereof.

19. The semiconductor device of claim 11, further comprising discrete external conductive elements operably coupled to the first TWI structure and the second TWI structure on at least one of the first surface and the second, opposing surface.

20. The semiconductor device of claim 19, wherein discrete external conductive elements are operably coupled to the first TWI structure and the second TWI structure on each of the first surface and the second, opposing surface.

* * * * *

UNITED STATES PATENT AND TRADEMARK OFFICE
CERTIFICATE OF CORRECTION

| | | |
|---|---|---|
| PATENT NO. | : 8,405,191 B2 | Page 1 of 1 |
| APPLICATION NO. | : 13/590991 | |
| DATED | : March 26, 2013 | |
| INVENTOR(S) | : Mark E. Tuttle | |

It is certified that error appears in the above-identified patent and that said Letters Patent is hereby corrected as shown below:

In the Claims

In column 12, line 33, in Claim 8, delete "clam" and insert -- claim --, therefor.

In column 12, line 48, in Claim 10, delete "clam" and insert -- claim --, therefor.

In column 12, line 64, in Claim 13, delete "(Ni" and insert -- (Ni) --, therefor.

Signed and Sealed this
Fourth Day of June, 2013

Teresa Stanek Rea
*Acting Director of the United States Patent and Trademark Office*